United States Patent
Kuroda

(10) Patent No.: US 9,562,949 B2
(45) Date of Patent: Feb. 7, 2017

(54) BATTERY MONITORING DEVICE

(71) Applicant: TOYOTA JIDOSHA KABUSHIKI KAISHA, Toyota-shi, Aichi-ken (JP)

(72) Inventor: Kazushi Kuroda, Miyoshi (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 150 days.

(21) Appl. No.: 14/643,308

(22) Filed: Mar. 10, 2015

(65) Prior Publication Data

US 2015/0260799 A1 Sep. 17, 2015

(30) Foreign Application Priority Data

Mar. 12, 2014 (JP) .................................. 2014-049498

(51) Int. Cl.
*G01N 27/416* (2006.01)
*G01R 31/36* (2006.01)
*H01M 10/42* (2006.01)
*H01M 10/44* (2006.01)
*G01R 31/02* (2006.01)

(52) U.S. Cl.
CPC ....... *G01R 31/3658* (2013.01); *G01R 31/3606* (2013.01); *H01M 10/4285* (2013.01); *H01M 10/441* (2013.01); *G01R 31/024* (2013.01); *G01R 31/028* (2013.01)

(58) Field of Classification Search
CPC .................................................. G01R 31/3658
USPC ........................................................ 324/434
See application file for complete search history.

(56) References Cited

U.S. PATENT DOCUMENTS

| 8,629,687 B2 * | 1/2014 | Ishikawa | G01R 31/026 320/134 |
| 2008/0164882 A1 * | 7/2008 | Jaeger | G01R 31/3658 324/434 |
| 2011/0050175 A1 * | 3/2011 | Odaohhara | H01M 10/443 320/134 |
| 2011/0285538 A1 | 11/2011 | Lee et al. | |
| 2012/0176160 A1 | 7/2012 | Sugimura | |
| 2013/0050891 A1 * | 2/2013 | Tanaka | H02J 7/0031 361/101 |

FOREIGN PATENT DOCUMENTS

| JP | 2009-083566 A | 4/2009 |
| JP | 2010-518357 A | 5/2010 |
| JP | 2012-147587 A | 8/2012 |
| JP | 5101748 B2 | 12/2012 |
| JP | 5160024 B2 | 3/2013 |
| JP | 2013-198368 A | 9/2013 |
| JP | 5326973 B2 | 10/2013 |
| WO | 2008/085934 A2 | 7/2008 |

* cited by examiner

*Primary Examiner* — Arun Williams
(74) *Attorney, Agent, or Firm* — Andrews Kurth Kenyon LLP

(57) ABSTRACT

A battery monitoring device includes a control unit; electric elements respectively connected in parallel to battery cells; main analog-digital converters that are respectively connected to the battery cells via the electric elements, and respectively detect voltages of the battery cells; and sub analog-digital converters that are respectively connected to the battery cells without using the electric elements, and respectively detect the voltages of the battery cells. The control unit is configured to determine whether there is a failure in each electric element based on a first voltage detection value detected by the main analog-digital converter, and a second voltage detection value detected by the sub analog-digital converter. The control unit is configured to limit a control range of a degree of charge as compared to that used during a normal control, when it is determined that there is a leak failure in at least one of the electric elements.

11 Claims, 9 Drawing Sheets

FIG. 4

| FAILURE SITE | DETAIL OF FAILURE | DETECTION METHOD | PRIORITY REGARDING FAIL-SAFE PROCESS | CONTROL RANGE |
|---|---|---|---|---|
| FILTER CAPACITOR | OPEN FAILURE | DEGREE OF RISING OF VOLTAGE WHEN STATE OF EQUALIZATION SWITCH IS CHANGED FROM ON STATE TO OFF STATE | 3 | C |
| | SHORT CIRCUIT | MAIN DETECTION VOLTAGE IS 0 V AND SUB DETECTION VOLTAGE IS EQUAL TO OR LARGER THAN 3 V | 1 | A |
| | LEAK | MAIN DETECTION VOLTAGE < SUB DETECTION VOLTAGE | 1 | A |
| EQUALIZATION SWITCH | OPEN FAILURE | NO CHANGE IN VOLTAGE | 2 | B |
| | LEAK | MAIN DETECTION VOLTAGE < SUB DETECTION VOLTAGE (SW=OFF) | 1 | A |
| | STICKING IN ON POSITION | MAIN DETECTION VOLTAGE ≤ 0.2 V | 1 | A |

FIG. 6

| FIRST CYCLE | SECOND CYCLE | THIRD CYCLE | FOURTH CYCLE | FIFTH CYCLE | SIXTH CYCLE |
|---|---|---|---|---|---|
| BASIC INFORMATION | BASIC INFORMATION | BASIC INFORMATION | BASIC INFORMATION | BASIC INFORMATION | BASIC INFORMATION |
| MAIN DETECTION VOLTAGES (SW=OFF) | MAIN DETECTION VOLTAGES (SW=OFF) | MAIN DETECTION VOLTAGES (SW=OFF) | MAIN DETECTION VOLTAGES (SW=OFF) | MAIN DETECTION VOLTAGES (SW=OFF) | MAIN DETECTION VOLTAGES (SW=OFF) |
| FAIL-SAFE SYSTEM INFORMATION 1 SUB DETECTION VOLTAGES (SW=OFF) | FAIL-SAFE SYSTEM INFORMATION 2 | FAIL-SAFE SYSTEM INFORMATION 3 DETERMINATION RESULT BASED ON DEGREE OF RISING | FAIL-SAFE SYSTEM INFORMATION 4 | FAIL-SAFE SYSTEM INFORMATION 5 | FAIL-SAFE SYSTEM INFORMATION 6 MAIN DETECTION VOLTAGES (SW=ON) |
| CRC | CRC | CRC | CRC | CRC | CRC |

CYCLIC REDUNDANCY CHECK (CRC)

BATTERY MONITORING DEVICE

INCORPORATION BY REFERENCE

The disclosure of Japanese Patent Application No. 2014-049498 filed on Mar. 12, 2014 including the specification, drawings and abstract is incorporated herein by reference in its entirety.

BACKGROUND OF THE INVENTION

1. Field of the Invention

The invention relates to a battery monitoring device.

2. Description of Related Art

There is a conventional semiconductor circuit in which when a diagnosis is performed on the equalization function of an equalization switching element in a discharge circuit, an initializing operation is performed such that a capacitor in a comparison circuit is charged with electric power corresponding to a difference between a voltage of a signal line and a threshold voltage, and another capacitor in the comparison circuit is charged with electric power corresponding to a difference between a voltage of another signal line and the threshold voltage. In a comparison operation, signal lines are connected to each other such that a voltage is input to each of the capacitors. In the case where the equalization process is not performed, when the output is at the L level (LOW level), it is determined that the equalization function is normally performed, and when the output is at the H level (HIGH level), it is determined that there is a failure, and in the case where the equalization process is performed, when the output is at the H level, it is determined that the equalization function is normally performed, and when the output is at the L level, it is determined that there is a failure (for example, refer to Japanese Patent Application Publication No. 2012-147587).

In the above-described circuit in related art, when there is a leak in the capacitor, the detected voltage of the capacitor is smaller than the actual voltage of the capacitor, and therefore, over-charging may occur. Further, over-charging may be caused when there is a leak in an electric element connected in parallel to a battery cell whose voltage is monitored, as well as when there is a leak in the electric element such as the capacitor.

SUMMARY OF THE INVENTION

The invention provides battery monitoring device that suppresses over-charging due to a leak in an electric element connected in parallel to a battery cell.

An aspect of the invention relates to a battery monitoring device including: a control unit disposed outside a battery stack including a plurality of battery cells; a plurality of electric elements that are respectively connected in parallel to the battery cells; a plurality of main analog-digital converters that are respectively connected to the battery cells via the electric elements, and respectively detect voltages of the battery cells; and a plurality of sub analog-digital converters that are respectively connected to the battery cells without using the electric elements, and respectively detect the voltages of the battery cells. The control unit is configured to determine whether there is a failure in each of the electric elements based on a first voltage detection value detected by the corresponding main analog-digital converter, and a second voltage detection value detected by the corresponding sub analog-digital converter; and the control unit is configured to limit a control range of a degree of charge as compared to the control range of the degree of charge used during a normal control, when the control unit determines that there is a leak failure in at least one of the electric elements.

Thus, according to the aspect of the invention, it is possible to provide the battery monitoring device that suppresses over-charging due to a leak in the electric element connected in parallel to the battery cell.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 4 is a diagram showing a relation among a failure site, a detail of a failure, a detection method, a priority regarding a fail-safe process and the control range;

DETAILED DESCRIPTION OF EMBODIMENTS

Hereinafter, embodiments of the invention will be described.

Figure 1:
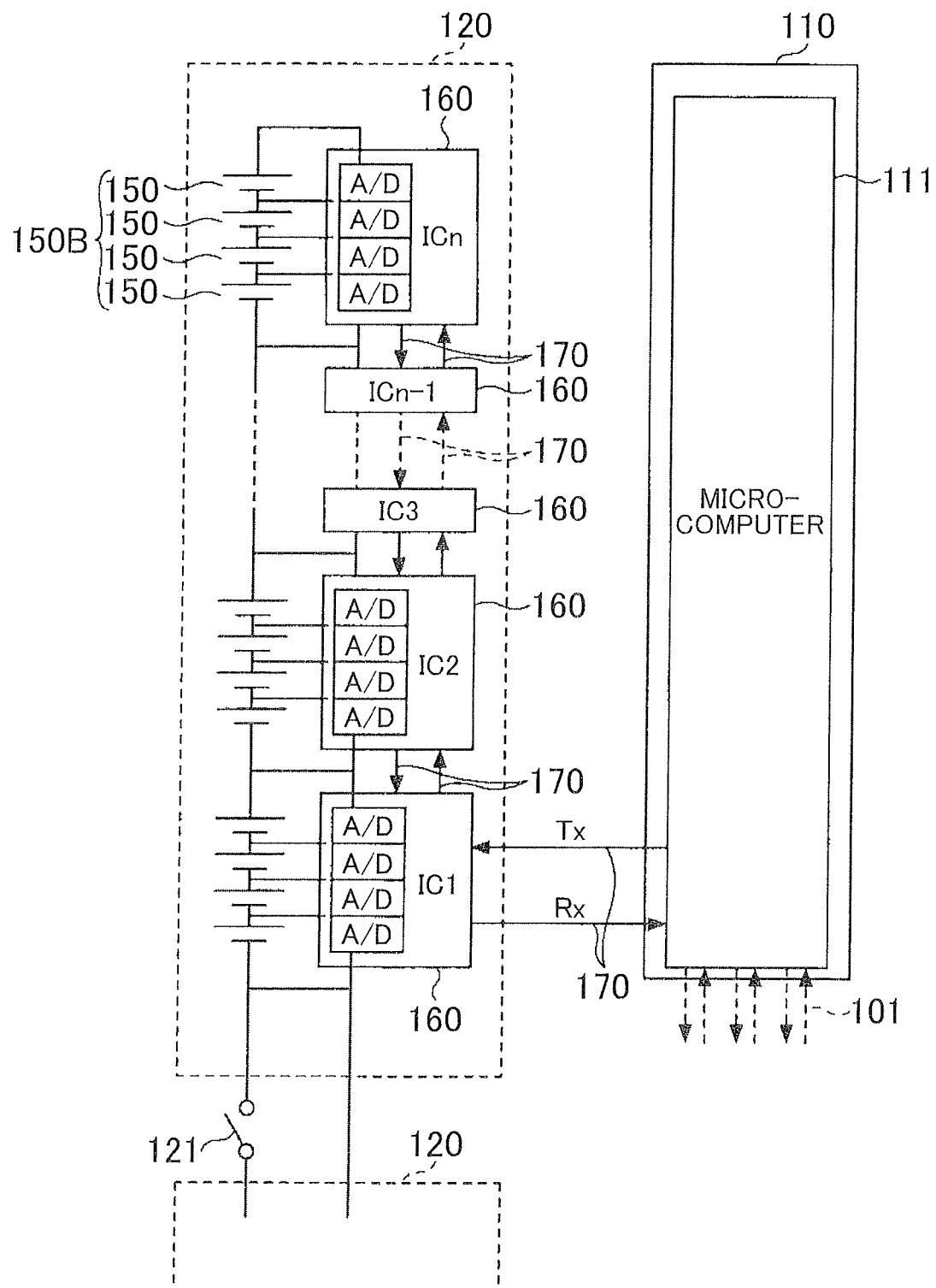
FIG. 1 is a diagram showing a battery unit including a battery monitoring device according to an embodiment of the invention.

FIG. 1 shows a battery unit 100 including a battery monitoring device according to an embodiment.

The battery unit 100 according to a first embodiment includes an Electric Control Unit (ECU) 110, and a stack 120 that are main constituent elements. The stack 120 includes a plurality of cells 150, and an "n" number of Integrated Circuit (IC) chip(s) 160 (that is, the number of the IC chips 160 is "n") ("n" is an integer equal to or larger than 1). A battery monitoring device according to the first embodiment includes the ECU 110, the IC chips 160 included in the stack 120, and a circuit between the IC chips 160 and the cells 150.

The battery unit 100 is used as a sensor control device that determines the state of a battery in, for example, a Hybrid Vehicle or an Electric Vehicle (EV).

FIG. 1 shows one ECU 110 and the "n" number of the IC chip(s) 160 (may be referred to as "IC1 to ICn) ("n" is an integer equal to or larger than 1) that are constituent elements of the battery monitoring device. FIG. 1 shows a microcomputer 111 that is a constituent element of the ECU 110. The ECU 110 is connected to other stacks via buses 101.

The IC1 to ICn and the ECU 110 are connected to each other via signal lines 170 in a daisy chain mode. A signal is forwarded to each signal line 170 in a direction indicated by an arrow. In FIG. 1, a command or the like transmitted from the ECU 110 is indicated by Tx, and a command, data, or the like received by the ECU 110 is indicated by Rx.

In this case, the ICn, which is farthest from the ECU 110, is referred to as the uppermost IC chip 160. The IC1, which is closest to the ECU 110, is referred to as the lowermost IC chip 160.

Each of the IC1 to ICn includes four Analog-to-Digital (A/D) converters. Each of the IC1 to ICn detects output voltages of the four cells 150 included in a corresponding block 150B, and converts the detected output voltages to digital values using the A/D converters, thereby obtaining voltage data. Further, in response to a voltage detection command transmitted from the ECU 110, each of the IC1 to ICn transmits the voltage data indicating the four output voltages, to the ECU 110 via the signal lines 170.

When the voltage detection command is input to each IC chip 160, the IC chip 160 generates the voltage data indicating the output voltages of the four cells 150, and transmits the voltage data to the ECU 110 via the signal lines 170. Each IC chip 160 forwards the voltage detection command to the other IC chip 160, and forwards the voltage data transmitted from the other IC chip 160. Each IC chip 160 operates in response to only the command from the ECU 110.

For example, each cell 150 is a lithium-ion secondary cell, that is, a secondary cell in which electricity is conducted by lithium-ions in an electrolyte.

In the battery unit 100 having the configuration described above, each IC chip 160 transmits the voltage data regarding the four cells 150, to the ECU 110.

Based on the voltage data transmitted from each IC chip 160, the ECU 110 adjusts the output voltages of the cells 150 included in the stack 120, by discharging electricity from the cell(s) 150 whose output voltage(s) is(are) equal to or larger than a predetermined voltage, among the cells 150 included in the stack 120.

The meaning of "the output voltage of the cell 150" is the same as the meaning of "the voltage between both terminals of the cell 150" or "the charging voltage".

Although FIG. 1 shows one stack 120, other stacks are connected to the one stack 120 in series or in parallel. A relay 121 is provided between the stack 120 shown in FIG. 1 and the other stack.

Each IC chip 160 is a monitoring integrated circuit (IC) that monitors the output voltages (cell voltages) of the cells 150. The total number of the IC chips 160 and each IC number (each of 1 to n) are stored in the ECU 110, and these pieces of information are included in the voltage detection command when the voltage detection command is transmitted.

When the ECU 110 determines that there is a failure in the stack 120 or the signal line 170, the ECU 110 executes a fail-safe process. The fail-safe process is a process that restricts a charging-discharging process in the battery unit 100. For example, while the fail-safe process is executed, the battery unit is controlled to output predetermined small electric power, or a charging-discharging control for the stack 120 is prohibited. A process that determines whether or not the ECU 110 should execute the fail-safe process will be described later.

Figure 2:
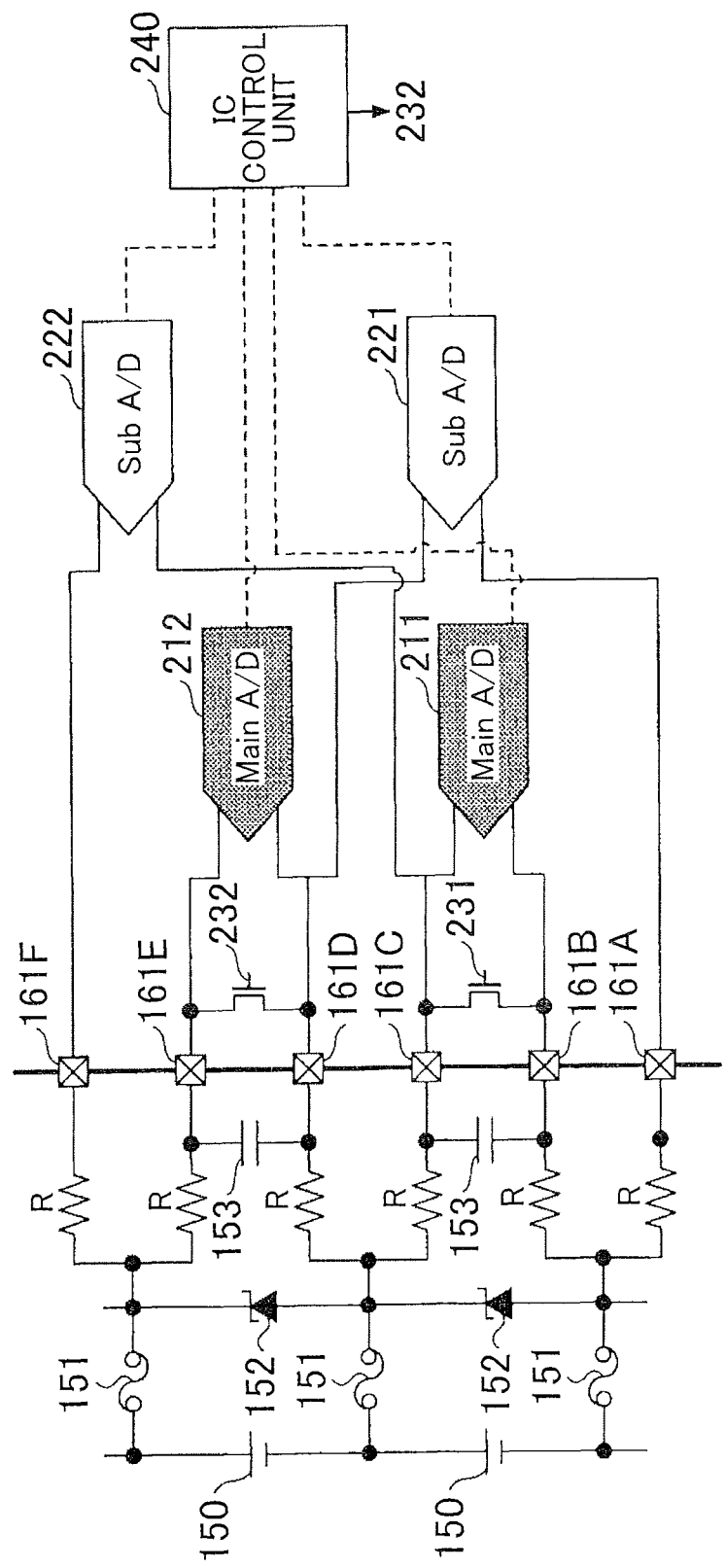
FIG. 2 is a diagram showing a circuit between cells and an IC chip, and an internal configuration of the IC chip.

FIG. 2 shows the circuit between the cells 150 and the IC chip 160, and an internal configuration of the IC chip 160. FIG. 2 shows a portion corresponding to the two cells 150.

Each cell 150 is connected to one Zener diode 152 via a pair of fuses 151. The Zener diode 152 is provided to stabilize the voltage of the cell 150 when the voltage of the cell 150 fluctuates. Since the Zener diode 152 is provided, when the cell 150 is over-charged, electric current flows in the fuses 151 and the Zener diode 152 to cut the fuses 151.

Each Zener diode 152 is connected to one filter capacitor 153 via a pair of resistors R. The resistors R and the filter capacitor 153 constitute an RC filter. The RC filter is provided between a main analog-digital (A/D) converter 212 and the cell 150 to remove high-frequency noise.

The ends of the filter capacitors 153 are connected to terminals 161B, 161C, 161D, and 161E of the IC chip 160, respectively. FIG. 2 shows the terminals 161A to 161F of the IC chip 160. That is, in FIG. 2, portions on the right side of the terminals 161A to 161F are disposed inside the IC chip 160 (i.e., internal portions of the IC chip 160).

The IC chip 160 includes the terminals 161A to 161F, main A/D converters 211, 212, sub analog-digital (A/D) converters 221, 222, equalization switches 231, 232, and an IC control unit 240.

Each of the main A/D converters 211, 212 is a main A/D converter of the IC chip 160, and corresponds to the A/D converter shown in FIG. 1. The main A/D converter 211 is connected to the cell 150 on the lower side among the two cells 150 shown in FIG. 2, via the terminals 161B, 161C, the pair of the resistors R, and the pair of the fuses 151.

The main A/D converter 212 is connected to the cell 150 on the upper side among the two cells 150 shown in FIG. 2, via the terminals 161D, 161E, the pair of resistors R, and the pair of the fuses 151.

That is, the main A/D converters 211, 212 are respectively connected to the two cells 150 shown in FIG. 2 via the RC filters including the filter capacitors 153. The main A/D converters 211, 212 respectively detect the cell voltages of the two cells 150 shown in FIG. 2. The main A/D converters that are not shown in FIG. 2 are connected to the cells 150 in a similar manner (refer to FIG. 1).

The sub A/D converters 221, 222 are connected to the cells 150 without using the RC filters including the filter capacitors 153, unlike the main A/D converter 211, 212.

The sub A/D converter 221 is connected to the cell 150 on the lower side via the terminal 161A, the terminal 161D, the resistors R, and the fuses 151. The filter capacitor 153 is not connected between the terminal 161A and the terminal 161D. Therefore, the sub A/D converter 221 is connected to the cell 150 on the lower side shown in FIG. 2 without using the RC filter including the filter capacitor 153.

The sub A/D converter 222 is connected to the cell 150 on the upper side shown in FIG. 2 via the terminal 161C, the terminal 161F, the resistors R, and the fuses 151. The filter capacitor 153 is not connected between the terminal 161C and the terminal 161F. Therefore, the sub A/D converter 222 is connected to the cell 150 on the upper side shown in FIG. 2 without using the RC filter including the filter capacitor 153.

The sub A/D converters 221, 222 respectively detect the cell voltages of the two cells 150 shown in FIG. 2.

In the IC chip 160, the equalization switch 231 is connected between a pair of terminals of the main A/D converter 211, and the equalization switch 232 is connected between a pair of terminals of the main A/D converter 212. That is, the equalization switch 231 is connected in parallel to the cell 150 on the lower side shown in FIG. 2, the Zener diode 152, and the filter capacitor 153. The equalization switch 232 is connected in parallel to the cell 150 on the upper side shown in FIG. 2, the Zener diode 152, and the filter capacitor 153.

Each of the equalization switches 231, 232 is a Metal Oxide Semiconductor (MOS) transistor, and the on/off state of the MOS transistor is switched by a control signal input from the IC control unit 240 to the gate.

The equalization switches 231, 232 are provided to equalize the cell voltages of the four cells 150 inside the block 150B (refer to FIG. 1). The IC control unit 240 turns on the equalization switches 231, 232 corresponding to the cells 150 other than the cell 150 having the smallest voltage among the four cells 150 inside the block 150B (refer to FIG. 1) so that electricity is discharged from the corresponding cells 150 and the voltages of the four cells 150 become equal to the smallest voltage.

The IC control unit 240 controls the equalization switches 231, 232 based on the command transmitted from the ECU 110 to the IC control unit 240.

The IC control unit 240 is connected to the output terminals of the main A/D converters 211, 212, and the sub A/D converters 221, 222. The IC control unit 240 transmits the cell voltages output from the main A/D converters 211, 212, to the ECU 110 via the signal lines 170 (refer to FIG. 1). The IC control unit 240 transmits the cell voltages output from the sub A/D converters 221, 222, to the ECU 110 via the signal lines 170 (refer to FIG. 1). As described above, the IC control unit 240 turns on/off the equalization switches 231, 232.

FIG. 2 shows the portion corresponding to the two cells 150 in FIG. 1. However, in reality, one block 150B includes the four cells 150 as shown in FIG. 1, and the stack 120 includes "n" number of blocks (i.e., the number of blocks included in the stack 120 is "n"). The circuit between the two cells 150 and the IC chip 160 shown in FIG. 2 and the internal configuration of the IC chip 160 shown in FIG. 2 apply to all the cells 150 shown in FIG. 1.

Next, a fail-safe process executed by the ECU 110 will be described.

The ECU 110 detects a failure in each of the Zener diodes 152, the filter capacitors 153, and the equalization switches 231, 232, using the above-described IC chip 160, and the circuit between the IC chip 160 and the cells 150, and executes the fail-safe process in accordance with a detail of the failure.

The fail-safe process is a process that restricts a charging-discharging process for the battery unit 100 by making the range of State of Charge (SOC) of the cell 150 smaller than the range of SOC used during a normal control (i.e., the range of SOC at a normal control time). The term "normal control time" signifies a time when the charging-discharging process is executed in a state in which there is no failure in the Zener diodes 152, the filter capacitors 153, the equalization switches 231, 232, and the like.

Figure 3:
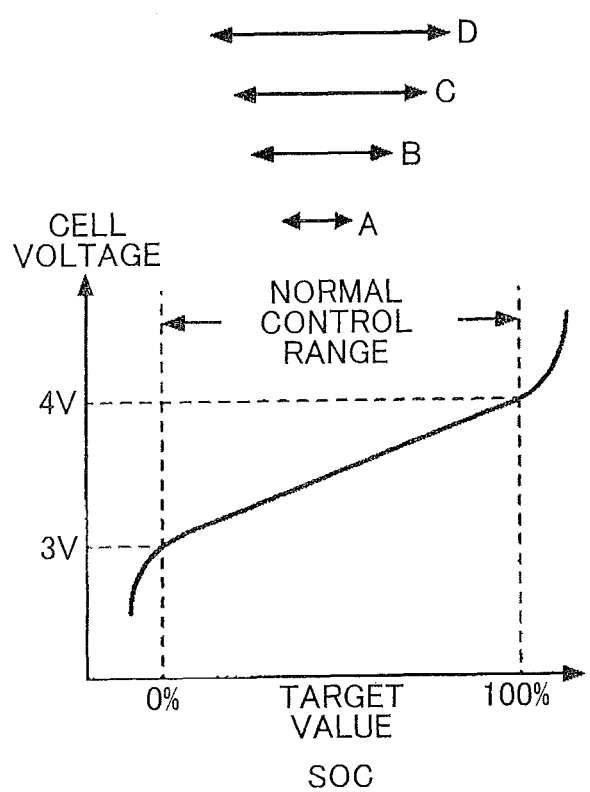
FIG. 3 is a diagram showing a relation between a control range of SOC and a cell voltage.

FIG. 3 shows a relation between the control range of SOC and the cell voltage. The abscissa axis indicates the SOC of the cell 150, and the ordinate axis indicates the cell voltage of the cell 150. In this case, the minimum value of the SOC during the normal control is indicated as 0% and the maximum value of the SOC during the normal control is indicated as 100%. When the SOC is 0%, the cell voltage is 3 V, and when the SOC is 100%, the cell voltage is 4 V. During the normal control, the target value of the SOC is set to, for example, 50% (3.5 V), and the charging-discharging is controlled so that the SOC is equal to or larger than 0% and equal to or smaller than 100%. In FIG. 3, the control range of the SOC during the normal control (0% SOC 100%) is shown as a normal control range.

As the cell voltage increases as shown by the solid curve, the SOC increases. A region where the SOC is smaller than 0% is a region where the cell 150 is over-discharged. A region where the SOC is larger than 100% is a region where the cell 150 is over-charged.

A battery monitoring device according to the embodiment makes the control range of the SOC smaller than the normal control range in accordance with the detail of the failure, as shown by double-headed arrows A, B, C, and D in FIG. 3. Among the control ranges of the SOC, the range A is the smallest range, and the range D is the largest range. The range A is a range set in the fail-safe process when the failure is relatively serious (the failure has the highest degree of importance (seriousness)). The range D is a range set in the fail-safe process when the failure has the lowest degree of importance (seriousness)). The ranges A to D are, for example, 20%, 40%, 60%, and 80%, respectively. Each of the ranges A to D is a range whose center is the target value.

Figure 5:
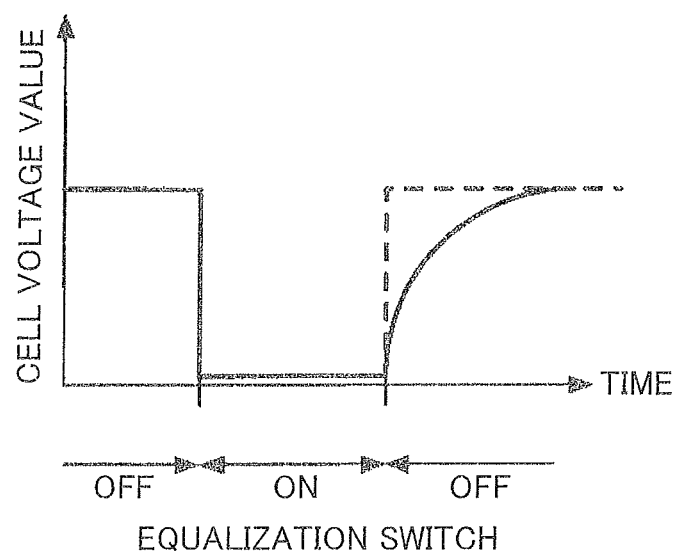
FIG. 5 is a diagram showing a rising waveform of a cell voltage when there is an open failure in a filter capacitor.

FIG. 4 shows a relation among a failure site, a detail of a failure, a detection method, the priority regarding the fail-safe process and the control range. FIG. 5 shows a rising waveform of the cell voltage when there is an open failure in the filter capacitor 153.

In this case, examples in which the failure sites are the filter capacitor 153 and the equalization switches 231, 232 will be described.

The details of the failure in the filter capacitor 153 include an open failure, a short circuit, and a leak failure. The state in which there is an open failure in the filter capacitor 153 is a state in which a line of at least one of electrodes of the filter capacitor 153 (refer to FIG. 2) is cut. That is, the state in which there is an open failure in the filter capacitor 153 is substantially the same as the state in which the filter capacitor 153 does not exist.

The state in which there is a short circuit in the filter capacitor 153 is the state in which there is a short circuit between the electrodes and the filter capacitor 153 does not function as the capacitor. The state in which there is a leak failure in the filter capacitor 153 is the state in which current flows between the electrodes.

The details of the failure in the equalization switches 231, 232 include sticking in the on position, an open failure (sticking in the off position), and a leak failure.

The state in which there is an open failure in the equalization switch 231 or 232 is the state in which the equalization switch 231 or 232 is stuck in the off position, and cannot be turned on. The state in which there is a leak failure in the equalization switch 231 or 232 is the state in which electric current flows between the drain and the source even when the equalization switch 231 or 232 is turned off.

The IC control unit 240 determines whether there is an open failure in the filter capacitor 153 based on the degree of rising of the cell voltage when the state of the corresponding equalization switch 231 or 232 is changed from the on state to the off state. The IC chip 160 transmits a result of determination to the ECU 110 via the signal lines 170. The ECU 110 determines whether there is an open failure in the filter capacitor 153 based on the result of determination received from the IC chip 160.

For example, as shown in FIG. 5, in the case where the state of the corresponding equalization switch 231 or 232 is changed from the off state to the on state, and is changed to the off state again, the waveform becomes a gradual waveform, that is, the cell voltage gradually rises as shown by the solid line, due to the time constant determined depending on the capacitance of the filter capacitor 153 when the state of the corresponding equalization switch 231 or 232 is changed from the on state to the off state during the normal operation.

In contrast, in a case where there is an open failure in the filter capacitor 153, when the state of the corresponding equalization switch 231 or 232 is changed from the on state to the off state, the cell voltage sharply rises as shown by the dashed line, because the state in which there is an open failure in the filter capacitor 153 is substantially the same as the state in which the filter capacitor 153 does not exist, and therefore, the waveform is not influenced by the time constant.

Accordingly, it is determined whether there is an open failure in the filter capacitor 153 based on the time required for the cell voltage to rise when the state of the corresponding equalization switch 231 or 232 is changed from the on state to the off state. Each cell 150 is connected to one filter capacitor 153. Therefore, if the time required for the cell voltage of one cell 150 to rise is short (i.e., if there is one cell 150 whose cell voltage rises sharply), it is determined that there is an open failure in the filter capacitor 153 corresponding to the one cell 150.

When it is determined whether there is a failure, the ECU 110 transmits the command to the IC chip 160 via the signal lines 170 to change the state of the equalization switches 231, 232 between the on state and the off state.

It is determined whether there is a short circuit in the filter capacitor 153, in the following manner.

When there is a short circuit in the filter capacitor 153, the output voltage of the main A/D converter (211 or 212), which detects the voltage between the both terminals of the filter capacitor 153, becomes 0 V. When there is no over-discharging, the cell voltage is equal to or larger than 3 V. Therefore, the output of the sub A/D converter (221 or 222), which corresponds to the main A/D converter (211 or 212) whose output is 0 V, is equal to or larger than 3 V. Therefore, it is determined whether there is a short circuit in the filter capacitor 153, based on whether the voltage detected by the corresponding main A/D converter (211 or 212) is 0 V, and the voltage detected by the corresponding sub A/D converter (221, 222) is equal to or larger than 3 V.

It is determined whether there is a leak failure in the filter capacitor 153 by comparing the voltage detected by the corresponding main A/D converter 211 or 212 and the voltage detected by the corresponding sub A/D converter 221 or 222, that is, based on whether the voltage detected by the corresponding sub A/D converter 221 or 222 is larger than the voltage detected by the corresponding main A/D converter 211 or 212 by a value equal to or larger than a predetermined voltage in a state in which the corresponding equalization switch 231 or 232 is off (SW=off).

It is determined whether there is a leak failure in each filter capacitor 153 by comparing the voltage detected by the main A/D converter 211 or 212 corresponding to the filter capacitor 153 and the voltage detected by the sub A/D converter 221 or 222 corresponding to the filter capacitor 153.

This determination is performed based on the signals that indicate the detected voltages and that are received by the ECU 110 from the IC chip 160 via the signal lines 170.

The determination is performed in the above-described manner, because when there is a leak failure in the filter capacitor 153, the voltage detected by the corresponding main A/D converter 211 or 212, which detects the voltage between the both terminals of the filter capacitor 153, decreases, whereas there is no influence on the voltage detected by the sub A/D converter 221 or 222 that detects the cell voltage without using the RC filter including the filter capacitor 153.

It is determined whether there is an open failure in each of the equalization switches 231, 232, based on whether the voltage detected by the corresponding main A/D converter 211 or 212 changes when the equalization switch 231 or 232 is turned on, because electricity is discharged from the cell 150 when the equalization switch 231 or 232 is turned on.

This determination is performed based on the signals that indicate the detected voltages and that are received by the ECU 110 from the IC chip 160 via the signal lines 170. When it is determined whether there is a failure, the ECU 110 transmits the command to the IC chip 160 via the signal lines 170 to change the state of the equalization switches 231, 232 between the on state and the off state.

It is determined whether there is a leak failure in each of the equalization switches 231, 232, by comparing the voltage detected by the main A/D converter 211 or 212 corresponding to the equalization switch 231 or 232 and the voltage detected by the sub A/D converter 221 or 222 corresponding to the equalization switch 231 or 232 in a state in which the equalization switch 231 or 232 is off.

The determination is performed in the above-described manner, because when there is a leak failure in the equalization switch 231 or 232, the voltage detected by the corresponding main A/D converter 211 or 212, which detects the voltage between the both terminals of the equalization switch 231 or 232, decreases, whereas there is no influence on the voltage that is detected by the corresponding sub A/D converter 221 or 222 without using the equalization switch 231 or 232.

The state in which the equalization switch 231 or 232 is stuck in the on position is the state in which the equalization switch 231 or 232 is maintained in the on state, and cannot be turned off. It is determined whether each of the equalization switches 231, 232 is stuck in the on position, based on whether the voltage detected by the corresponding main A/D converter 211 or 212 is equal to or smaller than 0.2 V in a state in which the equalization switch 231 or 232 is off. It is possible to determine whether each of the equalization switches 231, 232 is stuck in the on position, by detecting the voltage between the drain and the source using the corresponding main A/D converter 211 or 212 in a state in which the MOS transistor used as the equalization switch 231 or 232 is off.

For example, the priorities given to the failures for which the fail-safe process should be executed are as follows. The first priority (highest priority) is given to a leak failure and a short circuit in the filter capacitor 153, and a leak failure in the equalization switches 231 or 232, and the equalization switch 231 or 232 that is stuck in the on position. The second priority (the second highest priority) is given to an open failure in the equalization switch 231 or 232, and the third priority is given to an open failure in the filter capacitor 153.

The priorities are given as described above, taking into account the following facts. The filter capacitor 153 is an external component that is fitted to the outer side of the IC chip 160, that is, the filter capacitor 153 is not an internal component (for example, the equalization switches 231, 232) having relatively high reliability inside the IC chip 160. Further, when there is a leak failure in the filter capacitor 153, the voltage detected by the corresponding main A/D converter 211 or 212 is smaller than the actual voltage, and accordingly, the cell 150 may be over-charged.

The equalization switches 231, 232 are provided to equalize the voltages of the four cells 150 included in the block 150B (refer to FIG. 1), and when there is a leak failure in the equalization switch 231 or 232, the voltage detected by the corresponding main A/D converter 211 or 212 is smaller than the actual voltage, and accordingly, the cell 150 may be over-charged.

A higher priority may be given to a leak failure in the filter capacitor 153 than to a leak failure in the equalization switch 231 or 232, or a higher priority may be given to a leak failure in the equalization switch 231 or 232 than to a leak failure in the filter capacitor 153.

When there is a short circuit in the filter capacitor 153, the RC filter does not function well, and the cell voltage tends to be unstable, and the cell voltage cannot be detected by the corresponding main A/D converter 211 or 212, and accordingly, the cell voltage is detected by the corresponding sub A/D converter 221 or 222.

When the equalization switch 231 or 232 is stuck in the on position, equalization cannot be performed, and the cell voltage cannot be detected by the corresponding main A/D converter 211 or 212, and accordingly, the cell voltage is detected by the corresponding sub A/D converter 221 or 222.

The second priority (second highest priority) is given to an open failure in the equalization switch 231 or 232, because when there is an open failure in the equalization switch 231 or 232, equalization cannot be sufficiently performed, and accordingly, balance among the cell voltages may deteriorate.

The third priority is given to an open failure in the filter capacitor 153, because when there is an open failure in the filter capacitor 153, the RC filter does not sufficiently function, and accordingly, harmonic noise components cannot be sufficiently removed. This decreases the accuracy with which the corresponding main A/D converter 211 or 212 detects the cell voltage.

Figure 6:
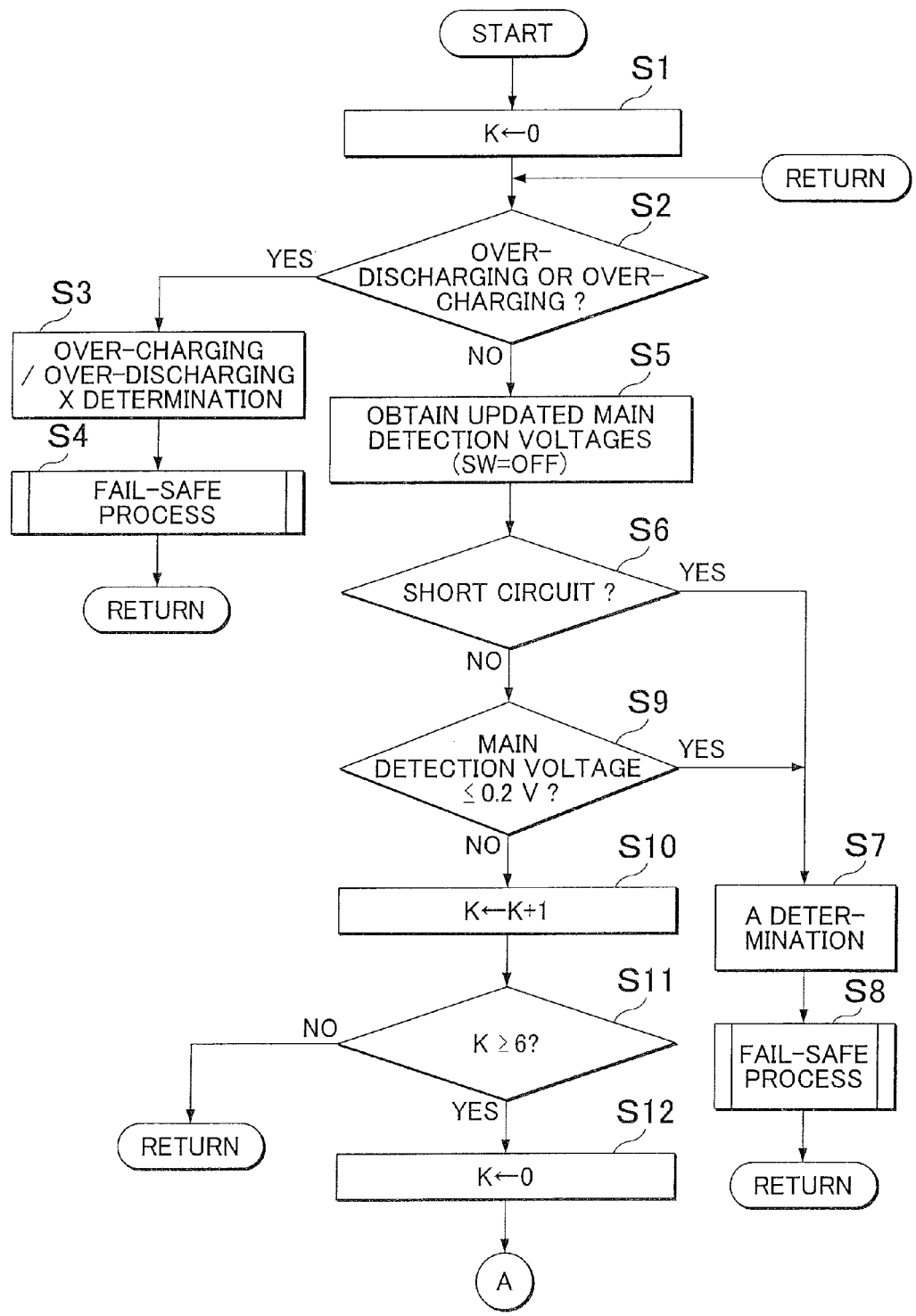
FIG. 6 is a diagram showing data transmitted from the IC chip to an ECU.

FIG. 6 shows data transmitted from the IC chip 160 to the ECU 110. FIG. 6 shows an example of data obtained in six control cycles.

Data transmitted from the IC chip 160 to the ECU 110 in each cycle includes, for example, basic information, the voltages detected by the main A/D converters 211, 212, information on a fail-safe system (hereinafter, referred to as fail-safe system information), and information on Cyclic Redundancy Check (CRC) (hereinafter, referred to as CRC information).

The basic information includes, for example, IC number of the IC chip 160. The voltages detected by the main A/D converters 211, 212 are the voltages detected by the four main A/D converters (211, 212) corresponding to the IC chip 160 in a state in which the equalization switches 231, 232 are off.

The fail-safe system information includes the voltages (sub-detection voltages) detected by the four sub A/D converters 221, 222 corresponding to the IC chip 160 in a state in which the equalization switches 231, 232 are off (SW=off), the voltages (main detection voltages) detected by the four main A/D converters 211, 212 corresponding to the IC chip 160 in a state in which the equalization switches 231, 232 are on (SW=on), and information indicating a result of determination as to whether there is an open failure in each of the filter capacitors based on the degree of rising of the corresponding cell voltage.

The CRC information is data for checking the data transmitted through the signal lines 170 constituting the daisy chain.

As shown in FIG. 6, the data in each cycle includes the voltages (main detection voltages) detected by the main A/D converters 211, 212 in a state in which the equalization switches 231, 232 are off. The fail-safe system information 1 in the first cycle includes voltages (sub detection voltages) detected by the sub A/D converters 221, 222 in the state in which the equalization switches 231, 232 are off (SW=off). The fail-safe system information 3 in the third cycle is information indicating a result of determination as to whether there is an open failure in each of the filter capacitors based on the degree of rising of the corresponding cell voltage when the state of the equalization switches 231, 232 is changed from the on state to the off state (i.e., a result of determination based on the degree of rising). The fail-safe system information 6 in the sixth cycle includes the voltages (main detection voltages) detected by the four main A/D converters 211, 212 corresponding to the IC chip 160 in the state in which the equalization switches 231, 232 are on (SW=on).

Each of the fail-safe system information 2 in the second cycle, the fail-safe system information 4 in the fourth cycle, and the fail-safe system information 5 in the fifth cycle includes appropriate data as necessary.

As described above, in each cycle, the IC chip 160 transmits the voltages that are detected by the main A/D converters 211, 212 in the state in which the equalization switches 231, 232 are off. In the third cycle among the sixth cycles, the IC chip 160 transmits the information indicating the result of determination as to whether there is an open failure in each of the filter capacitors based on the degree of rising of the corresponding cell voltage when the state of the equalization switches 231, 232 is changed from the on state to the off state. In the sixth cycle among the six cycles, the IC chip 160 transmits the voltages that are detected by the four main A/D converters 211, 212 corresponding to the IC chip 160 in the state in which the equalization switches 231, 232 are on.

Figure 7:
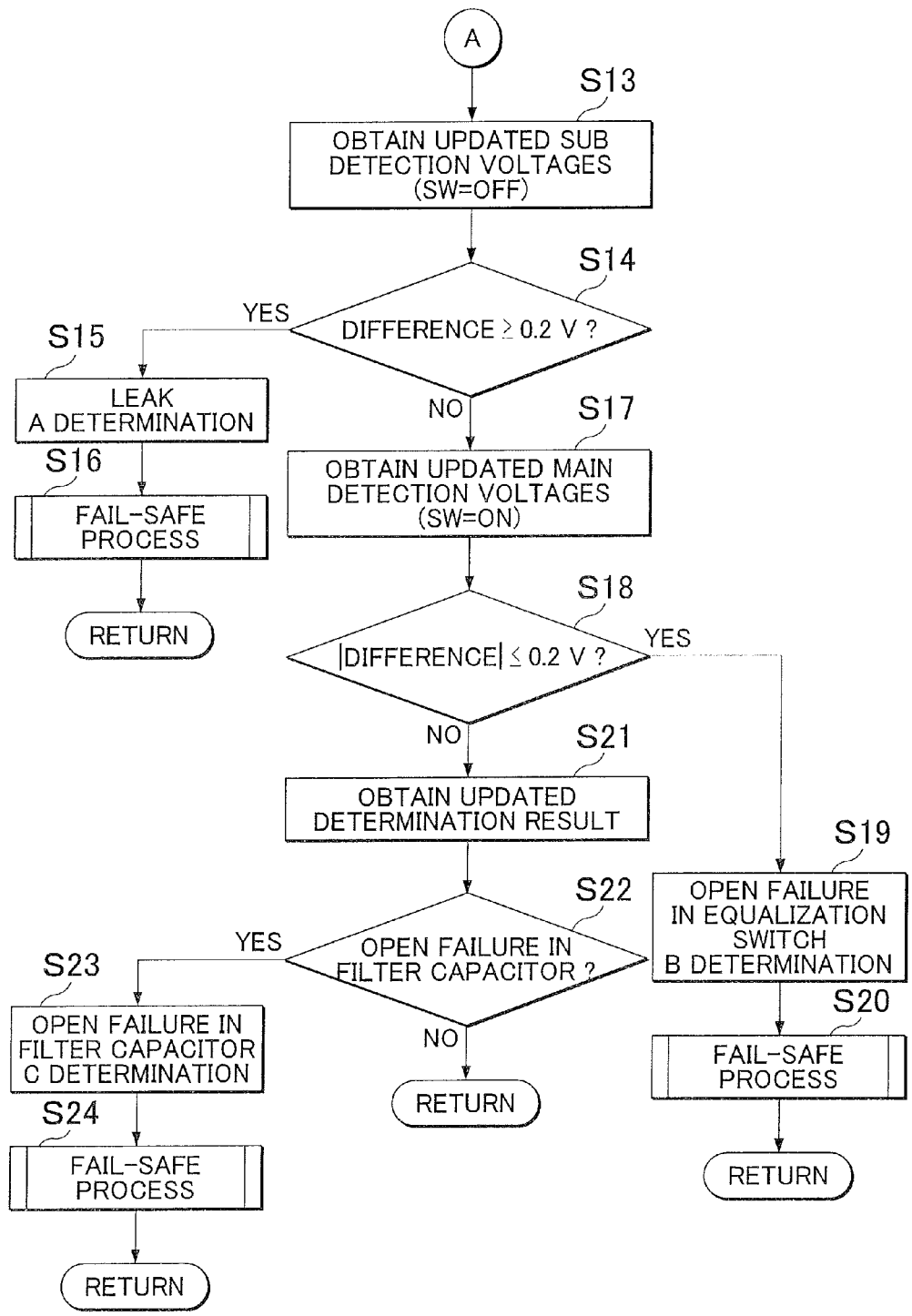
FIGS. 7A and 7B show a (first) flowchart showing the fail-safe process executed by the ECU.

FIGS. 7A and 7B show a (first) flowchart showing the fail-safe process executed by the ECU 110. In this case, the cycle number shown in FIG. 6 is represented by "k". The value of "k" is in a range of 1 to 6, and when the cycle number reaches 6, the cycle number is returned to 1. The cycle number repeatedly changes in this manner.

First, the ECU 110 resets the cycle number k to 0 (step S1).

ECU 110 determines whether each of the cells 150 is over-discharged or over-charged (step S2). This determination is performed based on whether the SOC, which is obtained based on the voltage detected by the main A/D converter and transmitted from the IC chip 160, is in the normal control range (in the range in which the SOC is equal to or larger than 0% and equal to or smaller than 100%).

When the ECU 110 determines that at least one of the cells 150 is over-discharged or over-charged (S2: YES), the ECU 110 makes an X determination due to the over-discharging or the over-charging (step S3), and executes the fail-safe process for the X determination (in step S4). After the ECU 110 finishes the fail-safe process, the flow returns to step S2.

When the ECU 110 determines that each of the cells 150 is not over-discharged or over-charged (S2: NO), the ECU 110 obtains, from the IC chip 160, the main detection voltages that are updated in the state in which the equalization switches 231, 232 are off (SW=off) (step S5).

Next, the ECU 110 determines whether there is a short circuit in each of the filter capacitors 153 (step S6). When there is a short circuit in the filter capacitor 153, the output of the corresponding main A/D converter (211 or 212), which detects the voltage between the both terminals of the filter capacitor 153, becomes 0 V. When the flow proceeds to step S6, there is no over-discharging, and therefore, each of the cell voltages is considered to be equal to or larger than 3 V. Accordingly, the output of the sub A/D converter (221 or 222), which corresponds to the main A/D converter (211, 212) whose output is 0 V, is equal to or larger than 3 V. Thus, it is determined whether there is a short circuit in each of the filter capacitors 153, based on whether the voltage detected by a corresponding one of the main A/D converters (211, 212) is 0 V and the voltage detected by a corresponding one of the sub A/D converters (221, 222) is equal to or larger than 3 V.

When the ECU 110 determines that there is a short circuit in at least one of the filter capacitors 153 (S6: YES), the ECU 110 makes an A determination (step S7), and executes the fail-safe process for the A determination (step S8). After the ECU 110 finishes the fail-safe process, the flow returns to step S2.

When the ECU 110 determines that there is no short circuit in the filter capacitors 153 (NO in step S6), the ECU 110 determines whether each of the main detection voltages is equal to or smaller than 0.2 V (step S9), in order to determine whether each of the equalization switches is stuck in the on position.

When the ECU 110 determines that at least one of the main detection voltages is equal to or smaller than 0.2 V (step S9: YES), the ECU 110 makes the A determination, and the flow proceeds to step S7.

When the ECU 110 determines that each of the main detection voltages is larger than 0.2 V (step S9: NO), the ECU 110 increments the cycle number "k" (k k+1) (step S10).

Next, the ECU 110 determines whether "k" is equal to or larger than 6 (step S11). The ECU 110 performs this determination in order to perform processes in step S12 and subsequent steps one time per six cycles.

When the ECU 110 determines that "k" is smaller than 6 (step S11: NO), the flow returns to step S2.

When the ECU 110 determines that "k" is equal to or larger than 6 (step S11: YES), the ECU 110 resets the cycle number "k" to 0 (step S12).

The ECU 110 obtains the sub detection voltages that are updated by the IC chip 160 in the state in which the equalization switches 231, 232 are off (SW=off) (step S13).

The ECU 110 determines whether a difference, which is obtained by subtracting each of the main detection voltages from the corresponding sub detection voltage, is equal to or larger than 0.2 V (step S14).

When the ECU 110 determines that the difference is equal to or larger than 0.2 V (step S14: YES), the ECU 110 determines that there is a leak failure in the corresponding filter capacitor or the corresponding equalization switch, and makes the A determination (step S15), and executes the fail-safe process for the A determination (step S16).

The ECU 110 obtains the main detection voltages that are updated by the IC chip 160 in the state in which the equalization switches 231, 232 are on (SW=on) (step S17).

The ECU 110 determines whether a difference, which is obtained by subtracting each of the main detection voltages (SW=on) from the corresponding main detection voltage (SW=off), is equal to or smaller than 0.2 V (step S18). That is, the ECU 110 determines whether the absolute value of the difference, which is obtained by subtracting each of the main detection voltages updated by the IC chip 160 in the state in which the equalization switches 231, 232 are on (SW=on) from the corresponding main detection voltage updated by the IC chip 160 in the state in which the equalization switches 231, 232 are off (SW=off), is equal to or smaller than 0.2 V.

When the ECU 110 determines that the absolute value of the difference is equal to or smaller than 0.2 V (step S18: YES), the ECU 110 determines that there is an open failure in the corresponding equalization switch (i.e., the equalization switch is stuck in the off position), and makes a B determination (step S19), and executes the fail-safe process for the B determination (step S20). After the ECU 110 finishes the fail-safe process, the flow returns to step S2.

When the ECU 110 determines that the absolute value of the difference is larger than 0.2 V (step S18: NO), the ECU 110 obtains a determination result updated by the IC chip 160 (step S21). The determination result is the result of the determination as to whether there is an open failure (a break in a line) in each of the filter capacitors 153, the determination being performed by the IC chip 160.

The ECU 110 determines whether the determination result indicates that there is an open failure (a break in a line) in at least one of the filter capacitors 153 (step S22). For example, the ECU 110 determines whether a flag indicates that there is an open failure (a break in a line) in at least one of the filter capacitors 153.

When the ECU 110 determines that the determination result indicates that there is an open failure (a break in a line) in at least one of the filter capacitors 153 (step S22: YES), the ECU 110 makes a C determination (step S23), and executes the fail-safe process for the C determination (step S24). After the ECU 110 finishes the fail-safe process, the flow returns to step S2.

Figure 8:
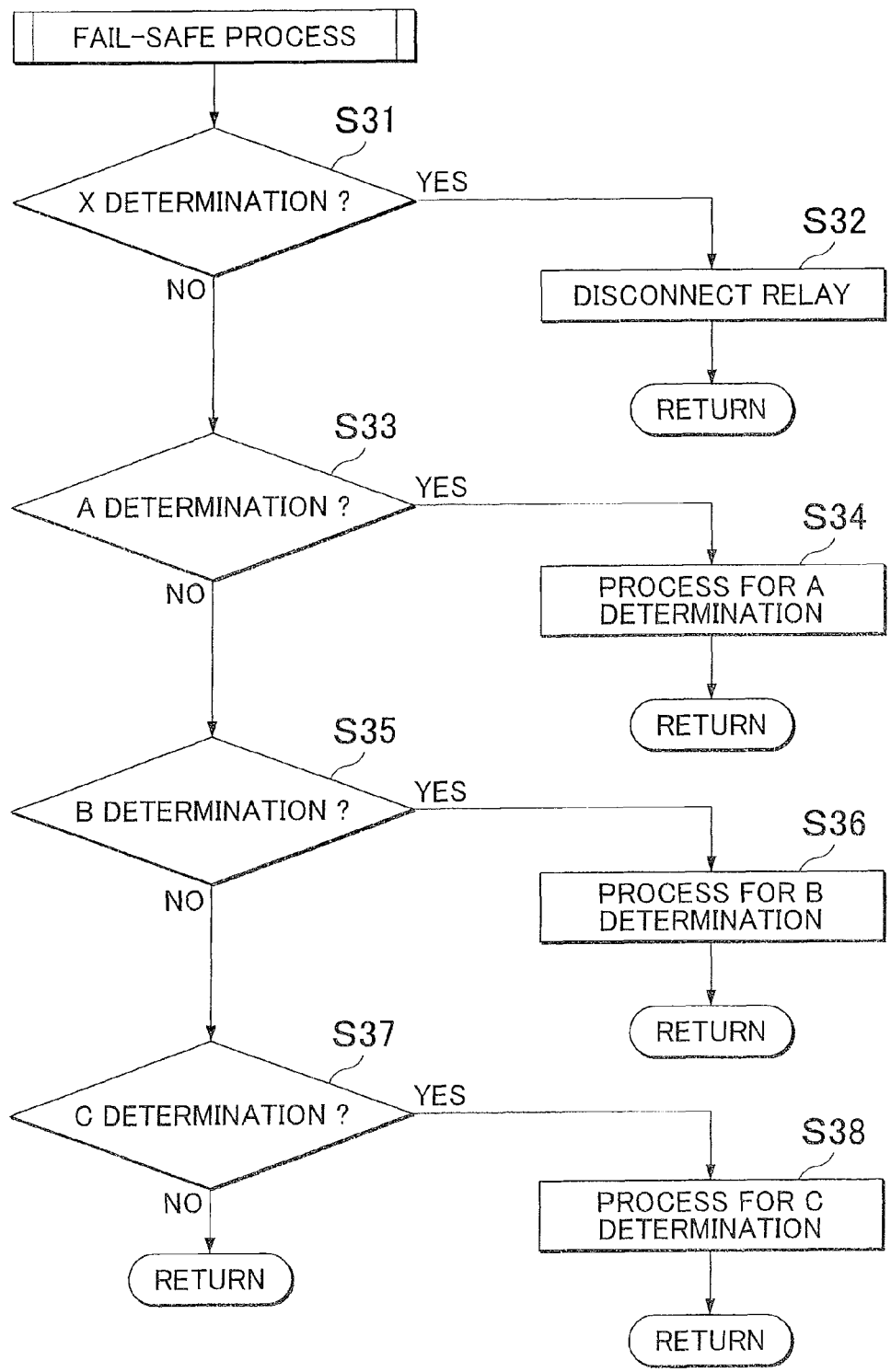
FIG. 8 shows a (second) flowchart showing the fail-safe process executed by the ECU.

FIG. 8 is a (second) flowchart showing the fail-safe process executed by the ECU 110.

When the ECU 110 executes the fail-safe process, the ECU 110 determines whether the determination is the X determination (step S31).

When the ECU 110 determines that the determination is the X determination (step S31: YES), the ECU 110 disconnects the relay 121 (refer to FIG. 1) (step S32). Thus, the battery unit 100 is brought to a state in which the voltage is not output from the battery unit 100. Therefore, for example, in a case where the battery unit 100 is provided in a hybrid vehicle that uses an engine and a motor as driving sources, the hybrid vehicle is brought to a state in which the hybrid vehicle travels using only the engine.

When the ECU 110 determines that the determination is not the X determination (step S31: NO), the ECU 110 determines whether the determination is the A determination (step S33).

When the ECU 110 determines that the determination is the A determination (step S33: YES), the ECU 110 executes the fail-safe process for the A determination (step S34).

When the ECU 110 determines that the determination is not the A determination (step S33: NO), the ECU 110 determines whether the determination is the B determination (step S35).

When the ECU 110 determines that the determination is the B determination (step S35: YES), the ECU 110 executes the fail-safe process for the B determination (step S36).

When the ECU 110 determines that the determination is not the B determination (step S35: NO), the ECU 110 determines whether the determination is the C determination (step S37).

When the ECU 110 determines that the determination is the C determination (step S37: YES), the ECU 110 executes the fail-safe process for the C determination (step S38).

After the process in each of steps S32, S34, S36, and S38 ends, the flow returns to step S2 (refer to FIGS. 7A and 7B).

Thus, according to the embodiment, it is possible to provide the battery monitoring device that suppresses overcharging due to a leak failure in the electric element connected in parallel to the cell 150 is suppressed.

Further, the fail-safe level is set according to the kind of failure, and thus, it is possible to effectively use the battery control. In other words, a supersensitive battery control is suppressed, and the control range is set according to the kind of failure, and thus, it is possible to increase the states in which the battery can operate.

In the above-described embodiment, the case, in which the range of the SOC is limited when there is a failure, has been described. However, when there is a failure, the charging-discharging control itself may be prohibited. Alternatively, when there is a failure, the maximum value of the cell voltage may be made equal to or smaller than a predetermined voltage.

In the above-described embodiment, failures in the filter capacitor 153 and the equalization switch 231 or 232 have been described. However, it may be determined whether there is a failure in an electric element other than the filter capacitors 153 and the equalization switches 231, 232.

For example, it may be determined whether there is an open failure (a break in a line) in the fuse 151. An open failure in the fuse 151 can be detected as follows. The equalization switches 231, 232 are divided into a group consisting of odd-numbered equalization switches and a group consisting of even-numbered equalization switches. The odd-numbered equalization switches are turned on in a state in which the even-numbered equalization switches are off, and then, the odd-numbered equalization switches are turned off and the even-numbered equalization switches are turned on. As a result, the cell voltages increase (for example, the cell voltages approximately double). Thus, it is possible to detect an open failure (a break in a line) in the fuse 151 corresponding to the cell 150 whose voltage does not increase.

It may be determined whether there is an open failure (a break in a line) in the resistor R. An open failure (a break in a line) in the resistor R can be detected as follows. The main detection voltage and the sub detection voltage are compared with each other. When the difference between the main detection voltage and the sub detection voltage increases to a certain value, it can be determined that there is an open failure (a break in a line) in the resistor R.

It may be determined whether there is a short circuit in the Zener diode 152. When there is a short circuit in the Zener diode 152, the main detection voltage decreases, and as a result, the difference between the main detection voltage and the sub detection voltage increases. Thus, when the difference increases to a certain value, it can be determined that there is a short circuit in the Zener diode 152. However, the method of determining whether there is a short circuit in the Zener diode is not limited to this method.

It may be determined whether there is a leak failure in the Zener diode 152. When there is a leak failure in the Zener diode 152, the main detection voltage detected by the main A/D converter connected in parallel to the Zener diode 152, in which there is the leak failure, decreases. When the difference between the main detection voltage of the cell 150 corresponding to the Zener diode 152 and the main detection voltage of the cell 150 on the upper side or the cell 150 on the lower side increases to a certain value, it can be determined that there is a leak failure in the Zener diode 152.

It may be determined whether there is an open failure (a break in a line) in the terminals 161B to 161E. When there is an open failure (a break in a line) in the terminals 161B to 161E, the difference between the main detection voltage and the sub detection voltage increases. Therefore, when the difference increases to a certain value, it can be determined that there is an open failure (a break in a line) in the terminals 161B to 161E.

It may be determined whether there is a short circuit in the terminals 161B to 161E. When there is a short circuit in the terminals 161B and 161C or in the terminals 161D and 161E, the main detection voltage detected by the corresponding main A/D converter 211 or 212 becomes 0 V. Therefore, it can be determined that there is a short circuit in the terminals 161B and 161C or in the terminals 161D and 161E. However, the method of determining whether there is a short circuit in the terminals is not limited to this method.

It may be determined whether there is a leak failure in the terminals 161B to 161E. When there is a leak failure in the terminals 161B and 161C or in the terminals 161D and 161E, the main detection voltage becomes smaller than the sub detection voltage. Therefore, when there is a certain voltage difference, it can be determined that there is a leak failure in the terminals 161B and 161C or in the terminals 161D and 161E.

The battery monitoring device according to example embodiments of the invention have been described. However, the invention is not limited to the example embodiments, and various modifications may be made without departing from the scope of the invention.

What is claimed is:

1. A battery monitoring device comprising:
a control unit disposed outside a battery stack including a plurality of battery cells;
a plurality of electric elements that are respectively connected in parallel to the battery cells;
a plurality of main analog-digital, converters that are respectively connected to the battery cells via the electric elements, and respectively detect voltages of the battery cells; and
a plurality of sub analog-digital converters that are respectively connected to the battery cells without using the electric elements, and respectively detect the voltages of the battery cells,
wherein:
the control unit is configured to determine whether there is a failure in each of the electric elements based on a first voltage detection value detected by the corresponding main analog-digital converter, and a second voltage detection value detected by the corresponding sub analog-digital converter; and
the control unit is configured to limit a control range of a degree of charge as compared to the control range of the degree of charge used during a normal control, when the control unit determines that there is a leak failure in at least one of the electric elements.

2. The battery monitoring device according to claim 1, wherein each of the electric elements is a filter capacitor or an equalization switch.

3. The battery monitoring device according to claim 1, wherein:
each of the electric elements is a filter capacitor;
the battery monitoring device further includes a plurality of equalization switches that are respectively connected in parallel to the filter capacitors, and equalize the degrees of charge in the battery cells;
the control unit is configured to determine whether there is an open failure in each of the filter capacitors based on a degree of change in the first voltage detection value when a state of the corresponding equalization switch is changed from an on state to an off state; and
the control unit is configured to limit the control range of the degree of charge as compared to the control range of the degree of charge used during the normal control, when the control unit determines that there is the open failure in at least one of the filter capacitors.

4. The battery monitoring device according to claim 3, wherein:

the control unit is configured to determine whether there is a leak failure in each of the filter capacitors based on the first voltage detection value and the second voltage detection value that are detected when the corresponding equalization switch is off; and the control unit is configured to limit the control range of the degree of charge as compared to the control range of the degree of charge used during the normal control, when the control unit determines that there is the leak failure in at least one of the filter capacitors.

5. The battery monitoring device according to claim 4, wherein the control range of the degree of charge limited when the control unit determines that there is the leak failure in at least one of the filter capacitors is smaller than the control range of the degree of charge limited when the control unit determines that there is the open failure in at least one of the filter capacitors.

6. The battery monitoring device according to claim 3, wherein:

the control unit is configured to determine whether there is a short circuit in each of the filter capacitors based on the first voltage detection value and the second voltage detection value; and the control unit is configured to limit the control range of the degree of charge as compared to the control range of the degree of charge used during the normal control, when the control unit determines that there is the short circuit in at least one of the filter capacitors.

7. The battery monitoring device according to claim 1, wherein:

each of the electric elements is an equalization switch;

the control unit is configured to determine whether there is a leak failure in each of the equalization switches based on the first voltage detection value and the second detection voltage value that are detected when the equalization switch is off; and the control unit is configured to limit the control range of the degree of charge as compared to the control range of the degree of charge used during the normal control, when the control unit determines that there is the leak failure in at least one of the equalization switches.

8. The battery monitoring device according to claim 1, wherein:

each of the electric elements is an equalization switch;

the control unit is configured to determine whether there is an open failure in each of the equalization switches based on the first voltage detection value detected when a state of the equalization switch is changed from an off state to an on state; and the control unit is configured to limit the control range of the degree of charge as compared to the control range of the degree of charge used during the normal control, when the control unit determines that there is the open failure in at least one of the equalization switches.

9. The battery monitoring device according to claim 1, wherein:

the electric elements include a plurality of filter capacitors, and a plurality of equalization switches that are respectively connected in parallel to the filter capacitors, and equalize the degrees of charge in the battery cells;

the control unit is configured to determine whether there is a leak failure in each of the filter capacitors based on the first voltage detection value and the second voltage detection value that are detected when the corresponding equalization switch is off;

the control unit is configured to limit the control range of the degree of charge as compared to the control range of the degree of charge used during the normal control, when the control unit determines that there is the leak failure in at least one of the filter capacitors;

the control unit is configured to determine whether there is an open failure in each of the equalization switches based on the first voltage detection value detected when a state of the equalization switch is changed from an off state to an on state; and the control unit is configured to limit the control range of the degree of charge as compared to the control range of the degree of charge used during the normal control, when the control unit determines that there is the open failure in at least one of the equalization switches.

10. The battery monitoring device according to claim 9, wherein the control range of the degree of charge limited when the control unit determines that there is the leak failure in at least one of the filter capacitors is smaller than the control range of the degree of charge limited when the control unit determines that there is the open failure in at least one of the equalization switches.

11. The battery monitoring device according to claim 7, wherein:

the control unit is configured to determine whether each of the equalization switches is stuck in an on position, based on the first voltage detection value detected when the equalization switch is off; and the control unit is configured to limit the control range of the degree of charge as compared to the control range of the degree of charge used during the normal control, when the control unit determines that at least one of the equalization switches is stuck in the on position.

* * * * *